US007459951B2

(12) United States Patent
Prodic

(10) Patent No.: US 7,459,951 B2
(45) Date of Patent: Dec. 2, 2008

(54) SELF-CALIBRATING DIGITAL PULSE-WIDTH MODULATOR (DPWM)

(75) Inventor: Aleksandar Prodic, Toronto (CA)

(73) Assignee: Exar Corporation, Fremont, CA (US)

( * ) Notice: Subject to any disclaimer, the term of this patent is extended or adjusted under 35 U.S.C. 154(b) by 167 days.

(21) Appl. No.: 11/359,045

(22) Filed: Feb. 22, 2006

(65) Prior Publication Data

US 2007/0195876 A1 Aug. 23, 2007

(51) Int. Cl.

| | |
|---|---|
| ***H03K 3/017*** | (2006.01) |
| ***H03K 5/04*** | (2006.01) |
| ***H03K 7/08*** | (2006.01) |

(52) U.S. Cl. ........................ 327/175; 327/172; 327/173; 327/174

(58) Field of Classification Search ................. 327/172, 327/173, 174, 175

See application file for complete search history.

(56) References Cited

U.S. PATENT DOCUMENTS

| | | | | |
|---|---|---|---|---|
| 2004/0222866 | A1* | 11/2004 | Stengel et al. | 332/109 |
| 2005/0146366 | A1* | 7/2005 | Steinschaden | 327/175 |
| 2006/0164142 | A1* | 7/2006 | Stanley | 327/172 |

OTHER PUBLICATIONS

Patella, B.J.; Prodic, A.; Zirger, A.; Maksimovic, D., "High-frequency digital PWM controller IC for DC-DC converters," Power Electronics, IEEE Transactions on , vol. 18, No. 1, pp. 438-446, Jan. 2003.*

International Search Report for PCT/US07/62428, Mar. 27, 2008, 8 pages.

* cited by examiner

*Primary Examiner*—Kenneth B Wells
*Assistant Examiner*—John W Poos
(74) *Attorney, Agent, or Firm*—Fliesler Meyer LLP

(57) ABSTRACT

A hybrid digital pulse width modulator can have a delay line with digitally programmable delay cells. The digitally programmable delay cells can be adjusted by a digital correction signal from a delay matching circuit.

16 Claims, 8 Drawing Sheets

110
DELAY MATCHING CIRCUIT 112
DELAY LINE REPLICA
CLOCK
DIGITAL CORRECTION SIGNAL LOGIC
102
DIGITAL CORRECTION SIGNAL
MSB
CLOCKED LOGIC
START
FIRST PORTION OF SWITCHING PERIOD
OUTPUT LOGIC
DPWM OUTPUT
104
DIGITAL DUTY CYCLE INPUT
UNLOCKED LOGIC 106
DELAY LINE
108
LSB
MULTIPLEXER
SECOND PORTION OF SWITCHING PERIOD

SELF-CALIBRATING DIGITAL PULSE-WIDTH MODULATOR (DPWM)

FIELD OF THE INVENTION

This invention relates to a programmable digital-pulse width modulator (DPWM), such as those used in digitally controlled dc-dc switch-mode power supplies.

BACKGROUND OF INVENTION

Digital control of low-power switch-mode power supplies (SMPS) can result in significant improvements of the characteristics of power supply system used in applications such as communication systems, consumer electronics, portable devices, and computers. The advantages of digital control include flexibility, low sensitivity on external influences and realization with a small number of external passive components.

Digital implementation also simplifies implementation of power supplies. Analog controllers usually require time-consuming redesign every time characteristics of the supplied devices change, which in modern electronics happens often. On the other hand, modern tools for automatic digital design allow short development process and fast modification of existing designs to accommodate new requirements.

Although the advantages of the digital realizations are known, in low-power applications, analog pulse width modulator (PWM) controllers are mainly used.

One of the main reasons for the sporadic use of digital controllers is lack of low-power hardware solutions for digital-pulse width modulators (DPWM), the key parts of every pulse-width modulated controller. The DPWM is required to operate at high switching frequency, which in existing switching converters exceeds 1 MHz, and to have high resolution (8 to 11 bits). The high resolution is necessary for tight output voltage regulation and for elimination of undesirable limit-cycle oscillations of the output voltage and inductor current.

In existing DPWM solutions the power consumption is usually proportional to the product of switching frequency and resolution and, in some cases, exceeds the power consumed by the output load, resulting in poor overall efficiency of digitally controlled SMPS.

Recent publications demonstrate digital systems that are able to produce high-resolution pulse-width modulated signals at high switching frequencies that range 400 kHz and 2 MHz.

Those solutions also show that the design of a high-resolution high-frequency DPWM is a challenging task. The presented architectures make various design compromises between on-chip area and power consumption, or between switching frequency and the resolution of the DPWM.

Conventional designs using a counter usually require a clock signal at a frequency that is at least several hundred times higher than the switching frequency of SMPS. Hence, they exhibit high power dissipation and require complex implementation when both high frequency and high resolution are required.

Designs that include a ring oscillator (delay cells) and a multiplexer have substantially lower power consumption but generally require a large on-chip area for the creation of high-resolution pulse-width modulated signals. In addition, the switching frequency of these solutions varies due to the variations of propagation times of delay cells comprising the ring oscillator. As a result, switching noise at an unpredictable frequency can occur and influence the operation of supplied devices.

Recently presented hybrid architectures successfully combine the two previously mentioned concepts to decrease the size and power consumption of digital pulse-width modulators. However, these solutions still suffer from the unstable switching frequency.

To stabilize the frequency the use of a phased-lock loop (PLL) and delay-locked loop (DLL) have been proposed in the past. In both of these solutions analog blocks are used to synchronize the frequency of the DPWM with an external clock. Similar to other systems utilizing PLL or DLL structures, the presented DPWM architectures have limited range of locking frequencies and suffer from potential instability problems. In addition, the DLL based realization requires clock frequency, which is only 8 times smaller than that of conventional counter-based solution and hence still has relatively high power consumption. For example, when 1 MHz switching frequency and 10-bit resolution are required the DLL structure requires 128 MHz clock signal. Even more, in the presented DLL based solution the resolution of the DPWM decreases as the switching frequency increases.

Segmented delay-line based DPWM architecture utilizes only two multiplexers and two sets of delay lines (slow and fast) to achieve small area, very low power consumption, and operation at constant switching frequency. In this solutions the propagation times of delay cells in slow and fast delay lines are different and set to have ratio 16:1. A clock propagating through combination of fast and delay cells creates the pulse-width modulated signal. In this solution ideal matching between the delays of the cells is assumed. Since, in reality, this condition is hard to achieve due to imperfections in implementation technology, a mismatch in delay cells usually exists. As a consequence the input-to-output characteristic of the DPWM is nonlinear and in some cases non-monotonic. The non-monotonic characteristic can cause instability of the whole controller and undesirable oscillations at the output of SMPS. In addition, the presented solution is designed for operation at a single switching frequency, as the clock frequency increases the resolution of DPWM decreases. On the other hand, a decrease in switching frequency limits the maximum value of duty ratio to a number smaller than one.

DETAILED DESCRIPTION

Figure 1:
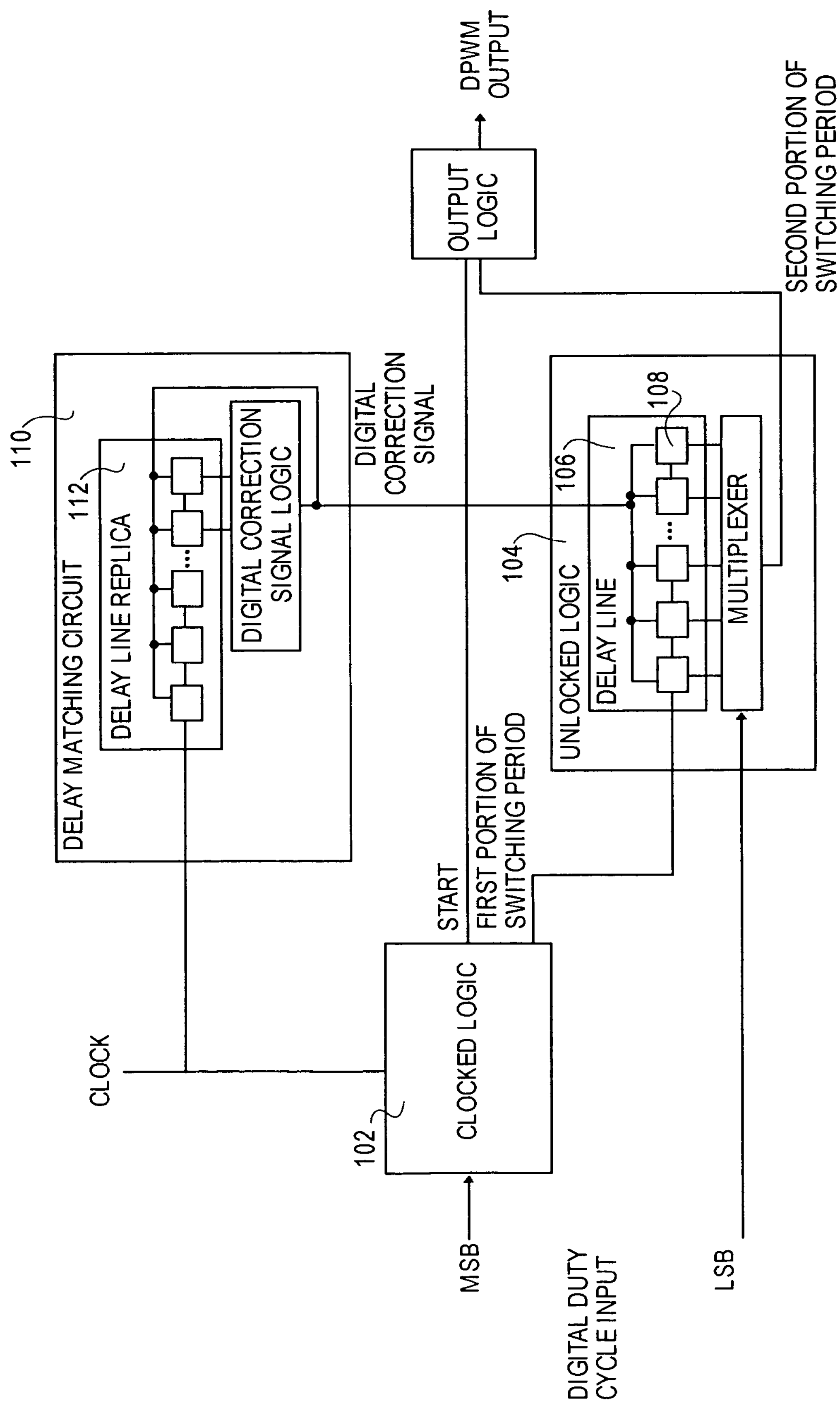
FIG. 1 is a diagram of a digital pulse width modulator of one embodiment.

One embodiment of the present invention uses a hybrid DPWM 100. The hybrid DPWM 100 can include clocked logic 102 to indicate a first portion of a switching period and unclocked logic 104 to indicate a second portion of a switching period. The unclocked logic 104 can include a delay line 106 that includes delay cells 108. The delay cells 108 can be digitally programmed with a digital correction signal. The delay matching circuit 110 can produce the digital correction signal to adjust the speed of the delay cells.

The use of digitally programmable delay cells 108 can reduce the required complexity of the hybrid DPWM 100.

In one example, a most significant bits (MSB) portion of a duty ratio input is sent to clocked logic 102 that can count out a number of clock periods equal to the MSB values to indicate the first portion. The unclocked logic 104 can use a least significant bits (LSB) portion of the duty ratio input to indicate a second portion that is a portion of a clock signal period long. The first and second periods can be combined to produce the DPWM output.

For example, an 8 bit duty ratio input can have 4 most significant bits that correspond to 0-15 clock periods for the first period, the 4 least significant bits can indicate from 0/16th to $15/16^{th}$ of a clock period for the second period of delay.

Each delay cell can provide 1/16th of a clock period delay. The delay cells can be digitally adjusted to maintain approximately a constant delay despite process and temperature variations.

The delay matching circuit 110 can be used to digitally adjust the delay cells. In one embodiment, a delay line replica 112 can be used to test whether the delay cells are running fast, running slow, or are running close to the correct speed. For example, the delay line replica can use a fixed period, such as clock period, or a half clock period when the clock signal has an accurate 50% duty cycle, to test how many digitally programmable delays cells the test signal passes through in the fixed period. If the test signal goes through too many delay cells in the delay line, the digital signal to the digitally adjustable delay cells is changed to reduce the delay of each delay cell. If the test signal goes through too few digitally programmable delay cells in the delay line replica 112, the digital correction signal to the digitally programmable delay cells is adjusted to increase the delay.

In one embodiment, we describe a self-calibrating high-frequency digital-pulse width modulator (DPWM) that can eliminate a number of problems and can have the characteristics listed bellow:

- It can be implemented with a simple and low-power digital hardware
- It can have a stable operation over a very wide range of adjustable constant switching frequencies, which span from several kHz to several MHz
- It can have linear and monotonic input-to-output characteristic
- It can have constant high resolution and full range of duty ratio values, i.e. 0 to 1, over the whole range of operating conditions.

Unlike some embodiments of the presented invention, other DPWM architectures do not combine all of these properties in a single architecture. Hence, each of them suffers from one or more problems such as excessive power consumption, low switching frequency and/or resolution, large chip area required for realization, variable switching frequency of operation, and unstable operation.

Figure 2:
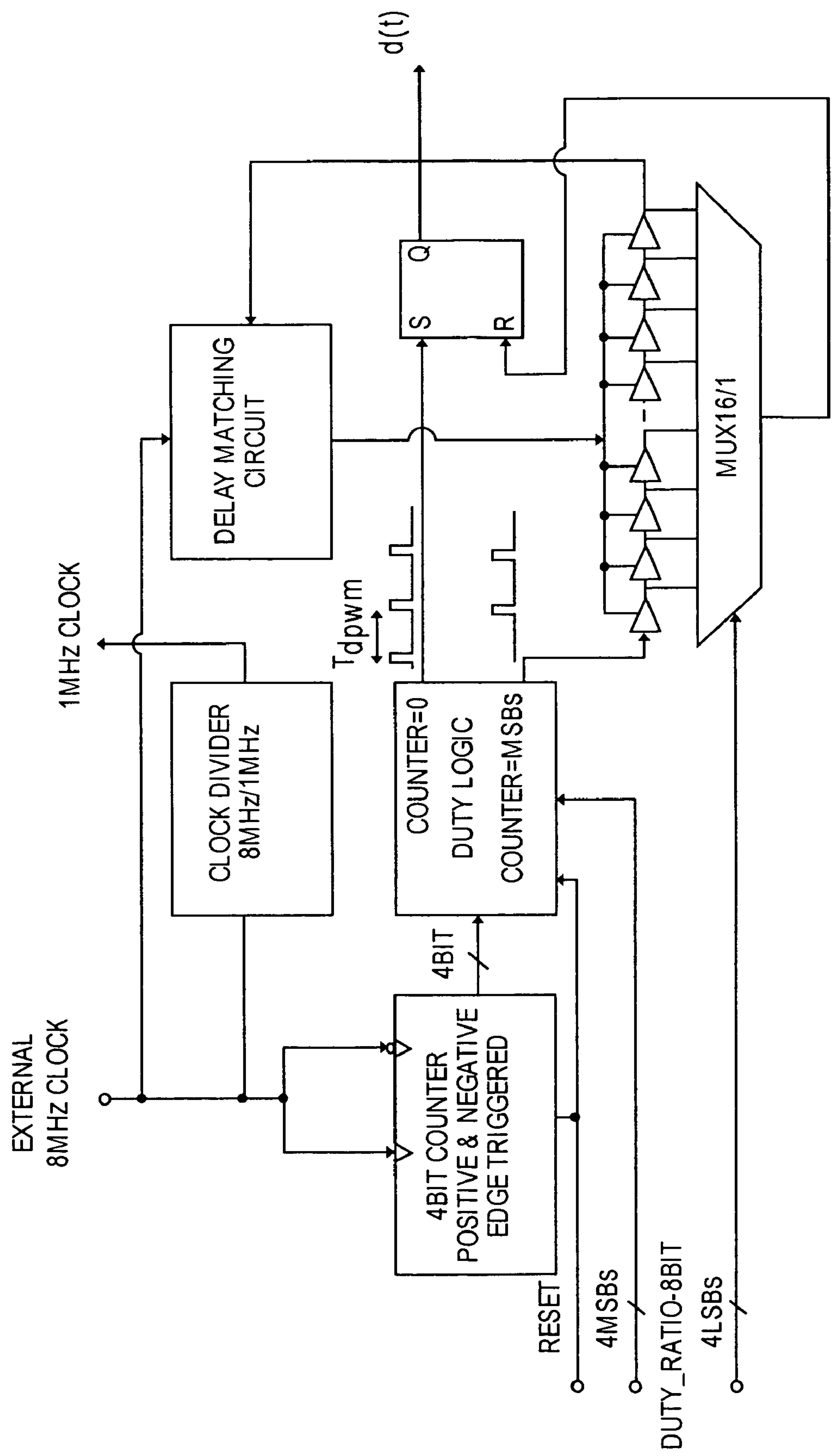
FIG. 2 is a diagram of an 8 bit implementation of a digital pulse width modulator of one embodiment.

FIG. 2 shows block diagram of a single-output 8-bit input implementation of one embodiment of the new digital-pulse width modulator of one embodiment.

The DPWM of this example includes a 4-bit ring counter, duty-logic circuit, set of delay cells forming a delay line, multiplexer, delay matching circuit and a set-reset (SR) latch. The duty ratio value of pulse-width modulated signal d(t) is defined through 8-bit Duty_Ratio input d[n], which 4 most significant bits (4-MSBs)=$d_{msb}$[n] are connected to duty logic block and 4 least significant bits (4-LSBs)=$d_{lsb}$[n] are tied to the multiplexer.

The example of FIG. 2 works as follows. At the beginning of each switching cycle 4-bit double-edge triggered counter, which is clocked at the frequency 8-times higher than the desired switching frequency, produces zero at the output. The zero output is detected by duty-ratio logic, which sets the RS latch and the output signal d(t) is high. After $d_{msb}$[n] clock cycles the output of the counter is equal to the 4-MSBs of the input of duty logic, resulting in the creation of a pulse that is passed to delay line, which total delay time is equal to the period of the counter clock signal, and its taps are connected to the multiplexer. When the signal propagating through the delay line reaches the tap selected by 4-LSBs of the input control word the output of multiplexer becomes high and resets the RS latch and output d(t) is low and a pulse which duration is proportional to input d[n] is formed. A new switching cycle starts when the ring counter reaches zero and the RS latch is set again.

Delay matching circuit can dynamically changes the delay of the cells to match to the total delay-line propagation time with a clock period and in that way eliminate nonlinearity problem characteristic for segmented based implementations.

Figure 3:
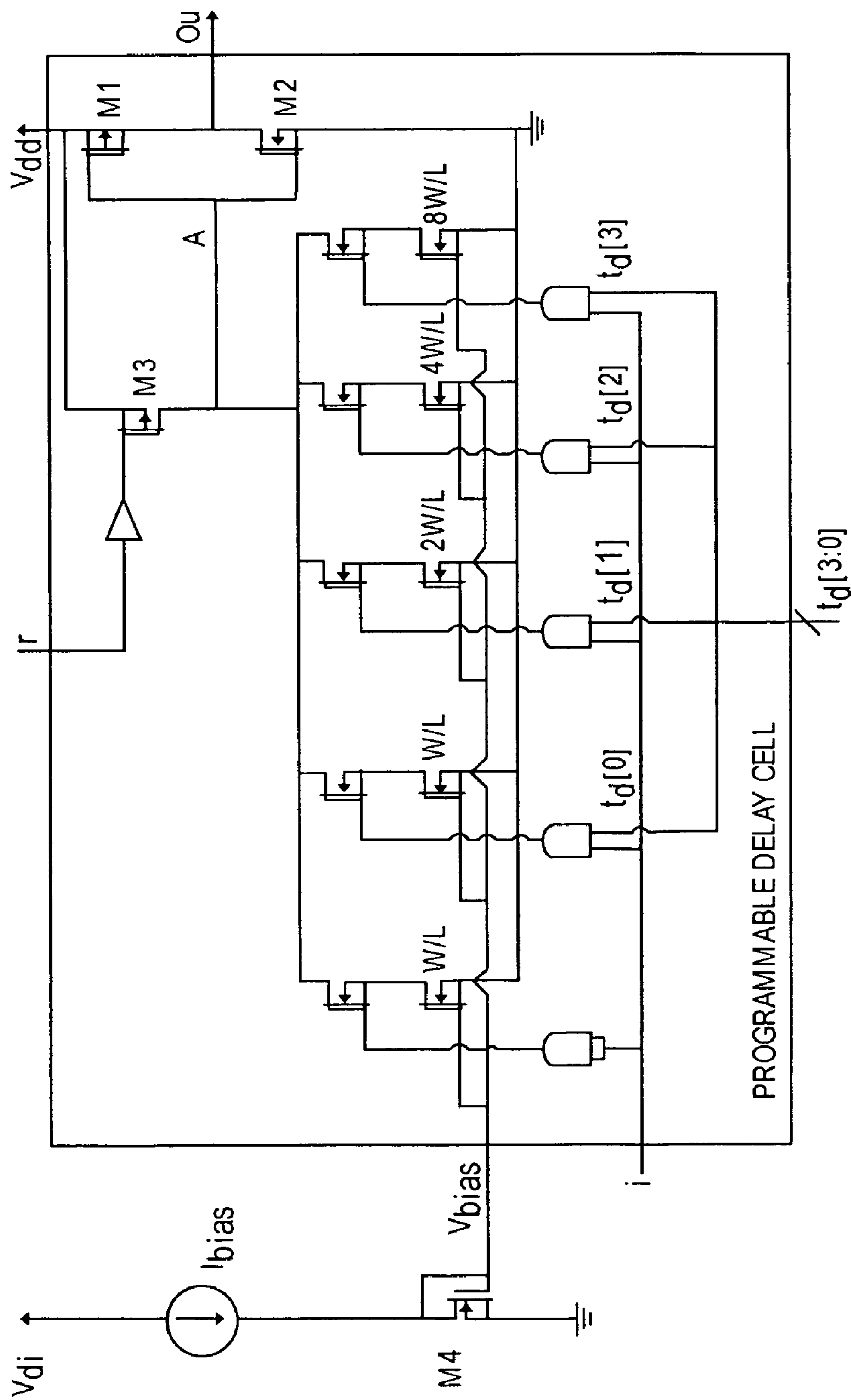
FIG. 3 is a diagram of a digitally programmable delay cell of one embodiment.

FIG. 3 shows a 4-bit programmable current starved delay cell of one embodiment. The cell includes of a five current mirroring stages that share the same biasing current and are sized in logarithmic fashion (W/L, W/L, 2W/L, 4W/L, and 8W/L). The propagation time of a digital signal passing from input i to the output Out depends on the amount of current discharging the equivalent capacitance seen at node A. Programmable delay time is achieved through delay control input $t_d$[3:0] that changes the number of current mirrored transistors operating in parallel, and hence varies the discharging current. In this case, the faster propagation time (smaller delay) is achieved when the number of conducting transistors is larger. Input r serves to reset the delay cell.

In delay line based structures, the propagation time of a delay cell is not constant. It usually varies due to changes in temperature and IC process variations. In the presented invention as well as in the segmented delay line based DPWM this variation can result in nonlinear or even non-monotonic dependence of the duty ratio value on the input control signal and in unpredictable behavior of digital controller.

Figure 4:
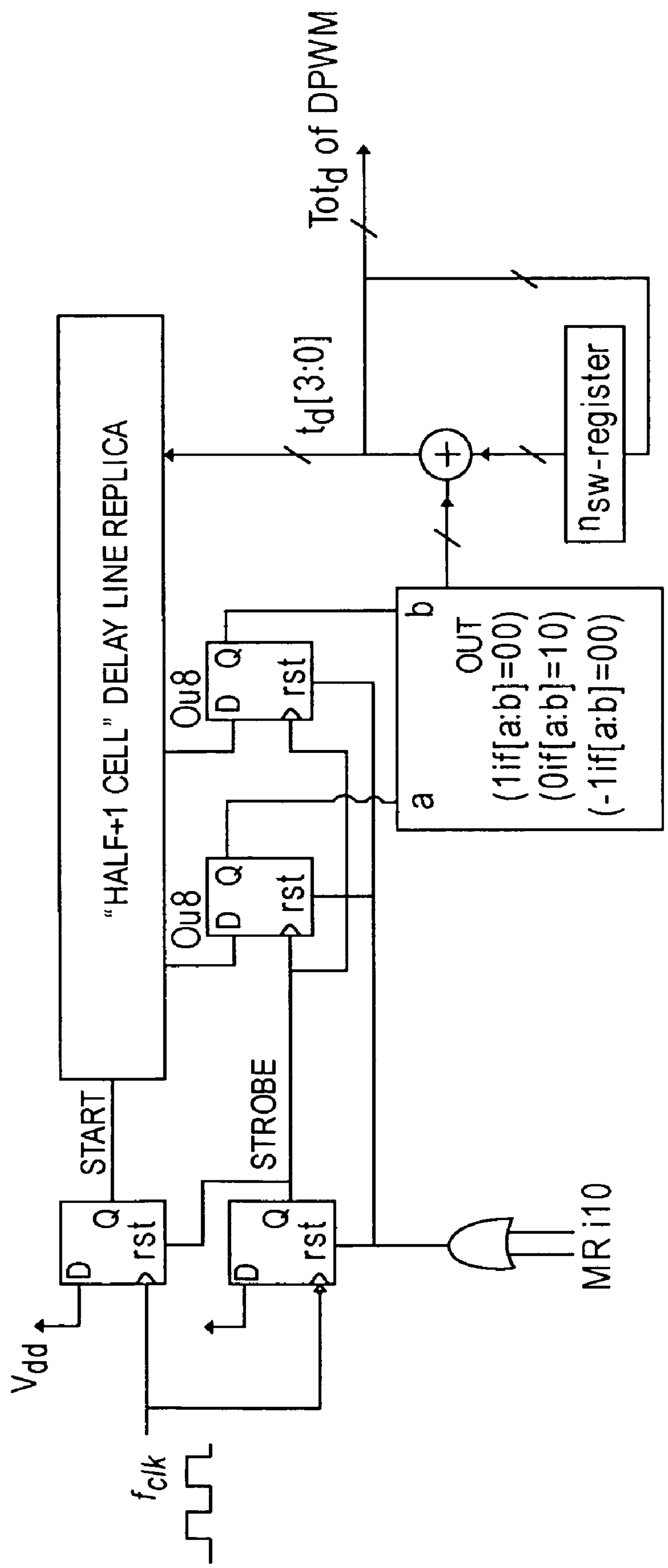
FIG. 4 is a diagram of a delay matching block of one embodiment.

The delay-matching block depicted in FIG. 4 dynamically adjusts the propagation time of delay line to compensate process and temperature variations and linearizes the DPWM characteristic. The matching block sets the total propagation time of 16 delay cells to be approximately the same as the period of the DPWM clock signal (see FIG. 2) ensuring that the increase of duty ratio value defined by 4-LSBs of d[n] is always smaller than the smallest increment caused by a change in 4-MSBs of d[n].

As shown in FIG. 4, the system can include a "Half+1 Cell" replica of the delay line, four edge-triggered D flip-flops, a combinatorial logic and a 4-bit register (accumulator). For the case when the DPWM presented in this invention consists of a 4-bit counter and 16:1 MUX, the "Half+1 Cells" replica of the delay line has only nine delay cells, identical to the sixteen cells of the DPWM. At a rising edge of the external clock the start signal is created, and passed through the delay line replica, whose $8^{th}$ and $9^{th}$ cell (N/2 and N/2+1) are connected to two edge triggered flip-flops. Then, at the immediately following negative edge, which occurs after a ½ of clock period, a strobe signal is created and a "snapshot" of the states of the cells 8 and 9 is taken and processed with a simple digital logic. Two zeroes at the outputs of the snapshot flip-flops indicate slower propagation and produce 1 at the output of the digital logic. As a result, the value of delay control register $t_d$[3:0] increases and the speed of cells increases accordingly. Two ones at the input of the digital logic indicate too fast propagation of the signal through delay cells and cause decrease of $t_c$. It is assumed that half periods of DPWM and external clock are equal when the snapshot value is 10 (binary) and the frequency register remains unchanged.

It should be noted that, in this case, an ideal external clock with exact 50% duty ratio is assumed. For the case when a non-ideal clock signal is applied, the present circuit needs minor modification. In that case, the delay line needs to be replaced with a "full-length+1" replica and start and strobe signal need to be created either with two positive or negative successive edges of the clock signal.

In the following section results obtained with an FPGA-based experimental prototype and an application specific integrated circuit employing the invention are presented. Both of the systems are implemented in accordance with the diagrams given in FIGS. 2 to 4. In FPGA implementation the analog delay cells are replaced with programmable digital cells.

The experimental results include verification of operation at high switching frequencies beyond 1 MHz and verification of the linearity of the DPWM.

In addition, the layout of a DPWM chip and results of its power estimation are given to prove that the invention can be realized on small chip area with low-power digital hardware.

A. Linearity Test

The linearity test is designed to verify monotonic and linear change of the DPWM duty ratio value as the digital input d[n] changes from its minimum value 0 to maximum value. For the test case shown in FIG. 5, the resolution of the DPWM is 10 bits and the converter operates at stitching frequency of 1.3 MHz.

Figure 5:
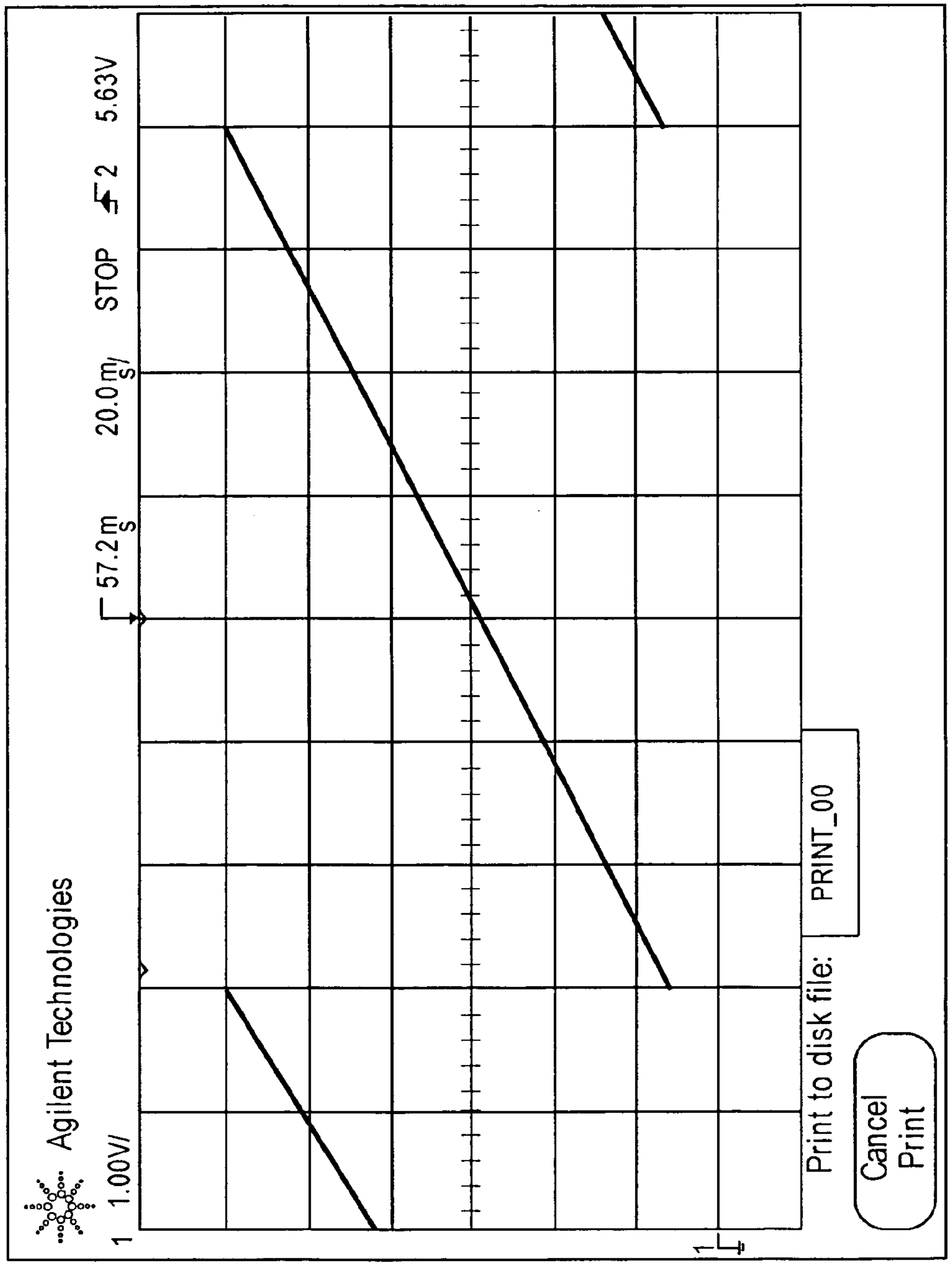
FIG. 5 is a diagram showing the output for different input values to a digital pulse width modulator of one embodiment.

FIG. 5 shows the change of the output of a dc-dc converter for gradual change of DPWM control value corresponding the change of duty ratio from 0 to 1 (the full change of duty ratio). The switching frequency of the converter is 1.3 MHz and the rate of the input d[n] change is 1-LSB every 100 switching cycles.

Results shown in FIG. 5 show that the output of the converter and accordingly duty ratio value change in monotonic and linear fashion proving that the DPWM has linear and monotonic input-to-output characteristic.

B. On-Chip Area and Power Consumption

Based on diagrams shown in FIGS. 2 to 4 a DPWM utilizing invented self-calibrating DPWM architecture was built in standard CMOS 0.18 μm process. The chip layout and table showing most important features of the IC verify very low power consumption and a requirement for small silicon area.

TABLE I

| | Characteristics of the IC | |
|---|---|---|
| | Power Consumption | Chip Area |
| 8-bit DPWM | 81 μW | 0.0526 $mm^2$ |

C. Operation at High-Switching Frequencies

Figure 6:
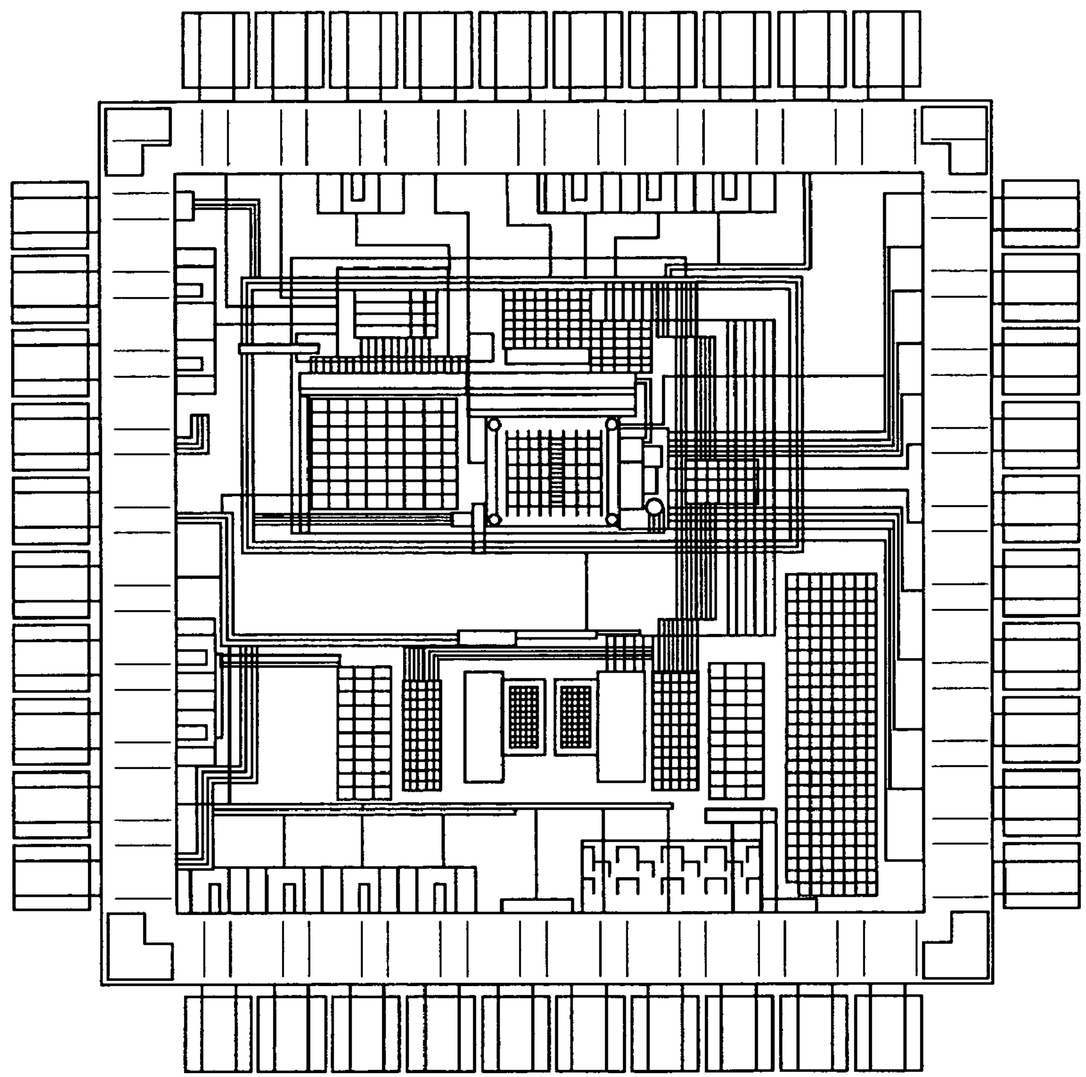
FIG. 6 shows a layout of an exemplary IC with a digital pulse width modulator of one embodiment.
Figure 7:
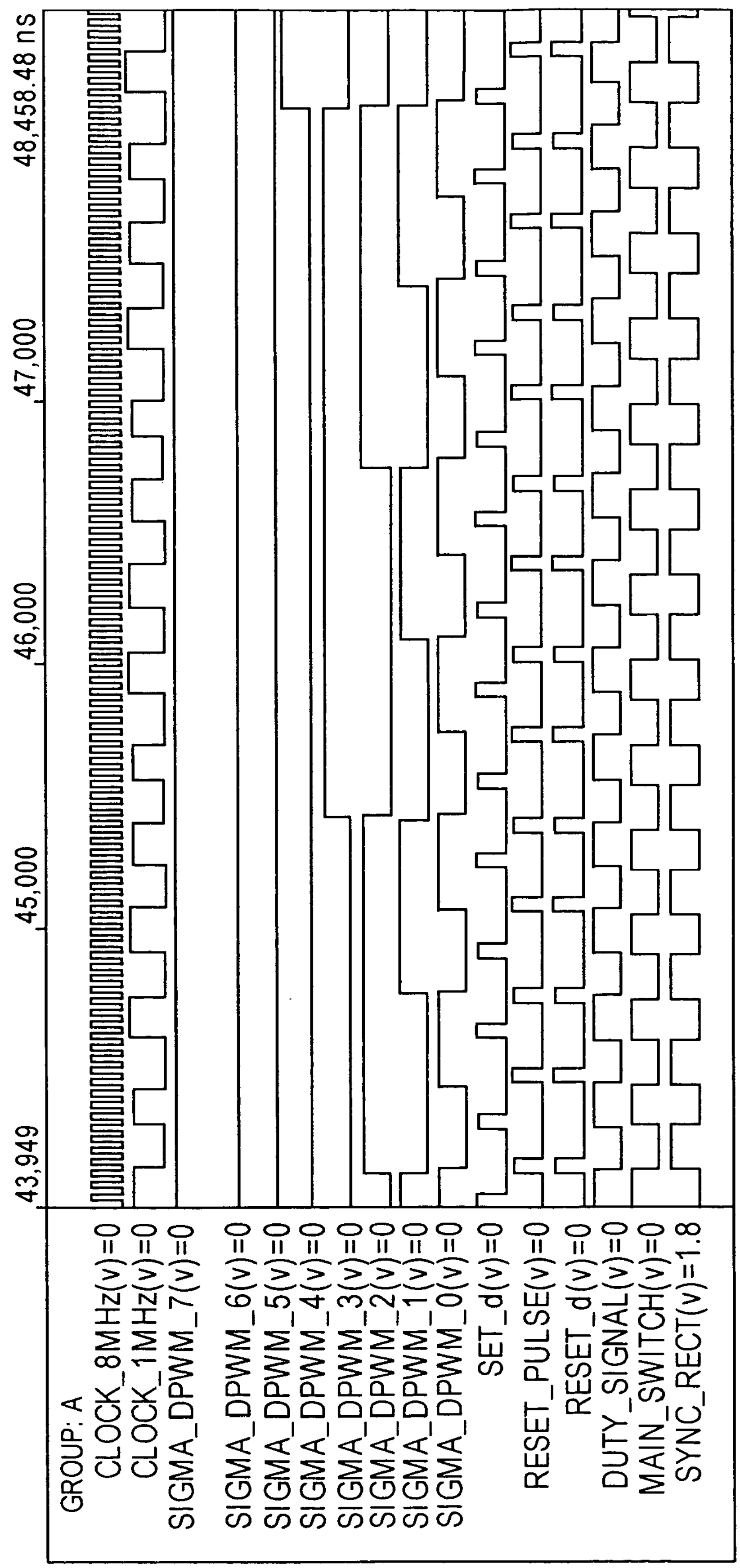
FIG. 7 shows an exemplary post-layout simulation of a digital pulse width modulator of one embodiment on an exemplary IC.

The diagrams shown in FIGS. 6 and 7 are results of post-layout simulations of the IC employing the invented DPWM architecture. They verify both the functionality and operation of the DPWM at high switching frequency.

The diagrams of FIG. 7 show PWM signal at 3 MHz duty, labeled as duty_signal (v), formed by using a clock 24 MHz, which is only 8 times higher than the switching frequency. Compared to the clock frequency of most of the other DPWM implementations this frequency is significantly smaller allowing realization with simpler hardware and significant reduction in power consumption.

FIG. 7 shows the results of post-layout simulation of an IC employing the invented DPWM architecture. Clock__8(v) is external clock signal at 24 MHz. Sigma_dpwm__0 (v) to sigma_dpwm__7 (v) comprise 8-bit control input d[n]). Set_d and reset_d are set and reset signals for RS latch (see FIG. 2) Duty_signal is output of the DPWM. Main_switch and sync_rect are inverted and non-inverted output signal.

Figure 8:
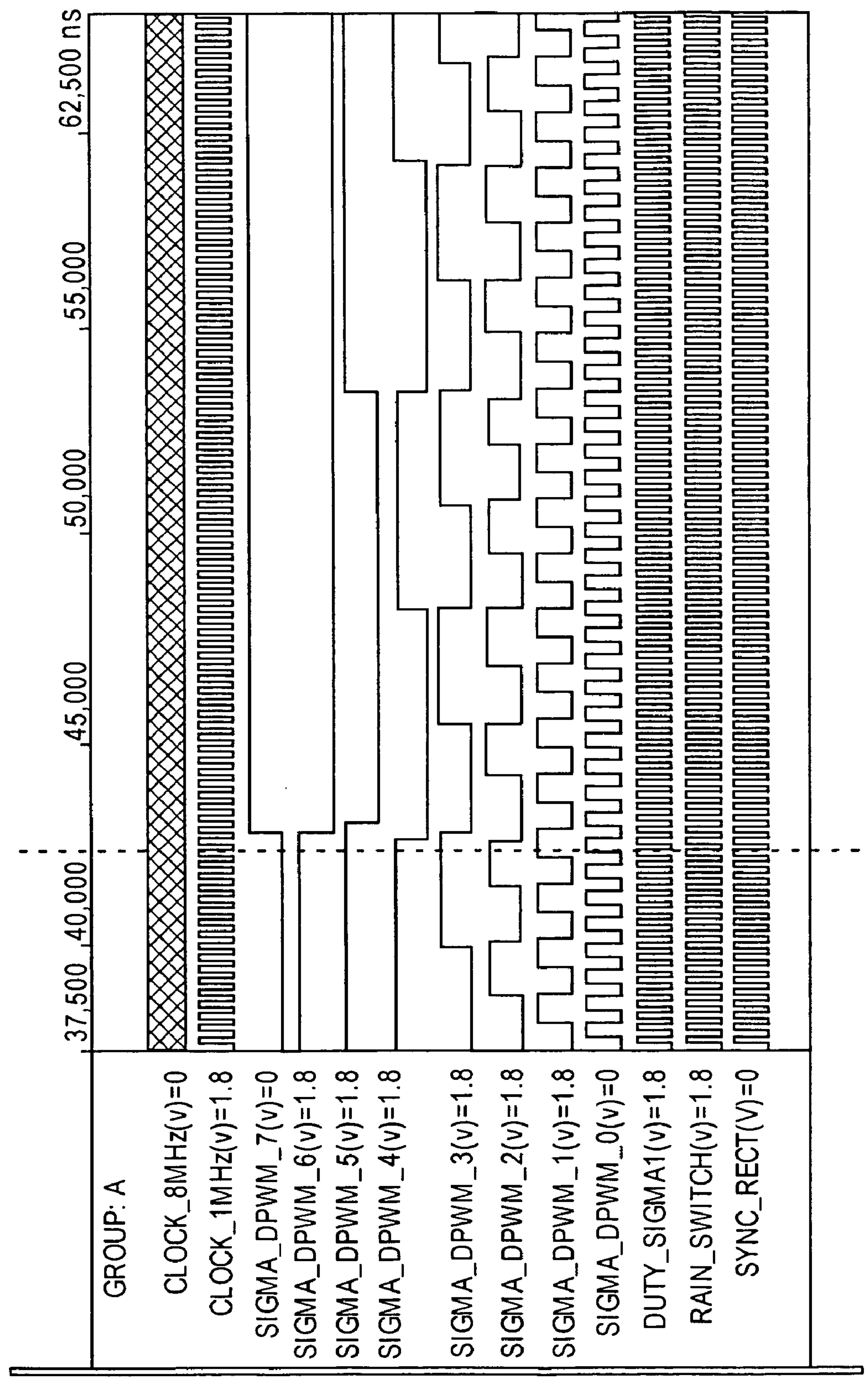
FIG. 8 shows operation of an exemplary DPWM over a large number of switching cycles when the input control value is changed gradually from zero to its maximum value.

FIG. 8 shows operation of the DPWM over a large number of switching cycles when the input control value d[n] changed gradually from 0 to its maximum value. It can be seen that the duty-ratio of the output signal changes accordingly. These diagrams are also another verification of operation at constant switching frequency and linear DPWM characteristic.

FIG. 8 illustrates the results of post-layout simulation over large number of switching cycles. Sigma_dpwm__0 (v) to sigma_dpwm__7 (v) comprise 8-bit control input d[n]. Set_d and reset_d are set and reset signals for RS latch (see FIG. 2). Duty_signal is output of the DPWM. Main_switch and sync_rect are inverted and non-inverted output signal.

The foregoing description of preferred embodiments of the present invention has been provided for the purposes of illustration and description. It is not intended to be exhaustive or to limit the invention to the precise forms disclosed. Many embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

What is claimed is:

1. A hybrid digital pulse width modulator comprising:

clocked logic to indicate a first portion of a switching period;

unclocked logic to indicate a second portion of a switching period, the unclocked logic including a delay line, the delay line including digitally programmable delay cells adjustable with a digital correction signal;

a delay matching circuit using a delay line replica to produce the digital correction signal, wherein an output signal is produced with a duty cycle determined from the first and second portion; and wherein the digital correction signal is a multi-bit value which turns on or off different sized transistors in the delay cells.

2. The hybrid digital pulse width modulator of claim 1, wherein the digitally programmable delay cells can have the delay adjusted by tuning on or off transistors in the delay cell.

3. The hybrid digital pulse width modulator of claim 2, wherein the transistors are in parallel.

4. The hybrid digital pulse width modulator of claim 1, wherein the delay line replica is used to set the speed of the delay cells.

5. The hybrid digital pulse width modulator of claim 1, wherein the delay line is associated with a multiplexer that produces an output after the second portion.

6. The hybrid digital pulse width modulator of claim 1, wherein the DPWM is part of a DC-to-DC converter.

7. A hybrid digital pulse width modulator comprising:

clocked logic to indicate a first portion of a switching period;

unclocked logic to indicate a second portion of a switching period, the unclocked logic including a delay line, the delay line including digitally programmable delay cells adjustable with a digital correction signal;

a delay matching circuit using a delay line replica to produce the digital correction signal, wherein an output signal is produced with a duty cycle determined from the first and second portion;

wherein the delay line replica is used to set the speed of the delay cells; and wherein the delay line replica is one half plus one the size of the delay line and is triggered by both edges of a clock.

8. A hybrid digital pulse width modulator comprising:

clocked logic to indicate a first portion of a switching period;

unclocked logic to indicate a second portion of a switching period, the unclocked logic including a delay line, the delay line including digitally programmable delay cells adjustable with a digital correction signal;

a delay matching circuit using a delay line replica to produce the digital correction signal, wherein an output signal is produced with a duty cycle determined from the first and second portion; and wherein the delay line replica is one delay cell longer than the delay line and the delay line replica is triggered by the same edge of two successive clock periods.

9. A digital pulse width modulator receiving a duty ratio value comprising:

duty logic to produce an output after a period of time corresponding to most significant bits of the duty ratio value;

a delay line receiving the output of the duty logic including digitally programmable delay cells, the delay line used to produce an output after a second period of time corresponding to least significant bits of the delay ratio value;

a delay matching circuit including a delay line replica used to adjust the transistors turned on in the delay cells to adjust the delay;

wherein the delay line replica produces a digital correction signal for the delay line; and wherein the delay matching circuit produces a multi bit value which turns on or off different sized transistors in the delay cell.

10. The digital pulse width modulator of claim 9, wherein the transistors are in parallel.

11. The digital pulse width modulator of claim 9, wherein the delay line replica is used to set the speed of the delay line.

12. The digital pulse width modulator of claim 9, wherein the delay line is associated with a multiplexer that produces the output after a second period of time.

13. The digital pulse width modulator of claim 9, wherein the DPWM is part of a DC-to-DC converter.

14. A digital pulse width modulator receiving a duty ratio value comprising:

duty logic to produce an output after a period of time corresponding to most significant bits of the duty ratio value;

a delay line receiving the output of the duty logic including digitally programmable delay cells, the delay line used to produce an output after a second period of time corresponding to least significant bits of the delay ratio value; a delay matching circuit including a delay line replica used to adjust the transistors turned on in the delay cells to adjust the delay;

wherein the delay line replica produces a digital correction signal for the delay line;

wherein the delay line replica is used to set the speed of the delay line; and wherein the delay line replica is one half plus one the size of the delay line and is triggered by both edges of a clock.

15. A digital pulse width modulator receiving a duty ratio value comprising:

duty logic to produce an output after a period of time corresponding to most significant bits of the duty ratio value;

a delay line receiving the output of the duty logic including digitally programmable delay cells, the delay line used to produce an output after a second period of time corresponding to least significant bits of the delay ratio value;

a delay matching circuit including a delay line replica used to adjust the transistors turned on in the delay cells to adjust the delay;

wherein the delay line replica produces a digital correction signal for the delay line; and wherein the delay line replica is one delay cell longer than the delay line and the delay line replica is triggered by the same edge of two successive clock periods.

16. A digital pulse width modulator receiving a duty ratio value comprising:

duty logic to produce an output after a period of time corresponding to most significant bits of the duty ratio value;

a delay line receiving the output of the duty logic including digitally programmable delay cells, the delay line used to produce an output after a second period of time corresponding to least significant bits of the delay ratio value;

a delay matching circuit including a delay line replica used to adjust the transistors turned on in the delay cells to adjust the delay;

wherein the delay line replica produces a digital correction signal for the delay line, further comprising set-reset logic associated with the duty logic and the delay line to produce the output of the DPWM.

* * * * *